(12) United States Patent
Itou et al.

(10) Patent No.: US 9,420,692 B2
(45) Date of Patent: Aug. 16, 2016

(54) VEHICULAR ELECTRONIC CONTROL DEVICE

(71) Applicant: DENSO CORPORATION, Kariya, Aichi-pref. (JP)

(72) Inventors: Akito Itou, Kariya (JP); Junji Sugiura, Hekinan (JP); Hirotsugu Kato, Hekinan (JP)

(73) Assignee: DENSO CORPORATION, Kariya (JP)

( * ) Notice: Subject to any disclaimer, the term of this patent is extended or adjusted under 35 U.S.C. 154(b) by 28 days.

(21) Appl. No.: 14/609,742

(22) Filed: Jan. 30, 2015

(65) Prior Publication Data

US 2015/0239407 A1    Aug. 27, 2015

(30) Foreign Application Priority Data

Feb. 26, 2014    (JP) .................................. 2014-35901

(51) Int. Cl.
*G01R 31/02* (2006.01)
*H05K 1/18* (2006.01)
*H05K 1/02* (2006.01)

(52) U.S. Cl.
CPC .............. *H05K 1/181* (2013.01); *H05K 1/0262* (2013.01); *H05K 1/0231* (2013.01); *H05K 2201/0746* (2013.01); *H05K 2201/09972* (2013.01)

(58) Field of Classification Search
CPC ............ H01L 23/12; H05K 1/02; H05K 1/18; H05K 1/181; H05K 1/231; H05K 1/262; H05K 3/46
See application file for complete search history.

(56) References Cited

U.S. PATENT DOCUMENTS

| 2012/0187759 A1* | 7/2012 | Kamichi | ................. B60L 3/003 307/10.1 |
| 2012/0274277 A1 | 11/2012 | Masuda et al. | |

FOREIGN PATENT DOCUMENTS

| JP | H11-87880 A | 3/1999 |
| JP | 2007-048879 A | 2/2007 |

\* cited by examiner

*Primary Examiner* — Minh N Tang
(74) *Attorney, Agent, or Firm* — Posz Law Group, PLC

(57) ABSTRACT

An electronic control device for executing fundamental and additional functions includes: a fundamental circuit element that executes the fundamental function; an additional circuit element that executes the additional function; and a printed wiring board having a rectangular shape divided into first and second regions. The fundamental circuit element is mounted in the first region, and the additional circuit element is mounted in the second region. The fundamental circuit element includes an operation voltage generating circuit for supplying an operation voltage to at least a part of the fundamental and additional circuit elements and a bypass capacitor for functioning for the additional circuit element. The bypass capacitor is connected to a power source wiring pattern for supplying the operation voltage to the additional circuit element. The bypass capacitor is arranged in the first region at a position nearer the second region than the operation voltage generating circuit.

6 Claims, 3 Drawing Sheets

VEHICULAR ELECTRONIC CONTROL DEVICE

CROSS REFERENCE TO RELATED APPLICATION

This application is based on Japanese Patent Application No. 2014-35901 filed on Feb. 26, 2014, the disclosure of which is incorporated herein by reference.

TECHNICAL FIELD

The present disclosure relates to a vehicular electronic control device for executing a fundamental function and an additional function, which is selectively added to the fundamental function.

BACKGROUND

Recently, as described in WO 2011/086695 corresponding to US 2012/0274277 A1, a hybrid vehicle having a plug-in function for executing a charging operation of a high voltage battery using an external battery charging facility has been developed. When the hybrid vehicle has the plug-in function, it is necessary to activate an electronic control device (or electronic control unit, ECU) so that the plug-in function is executed under a condition that a main switch such as an ignition switch of the vehicle is in an off state.

Accordingly, in a construction described in WO 2011/086695, a plug-in ECU (i.e., PLG-ECU) for controlling the battery charging device is activated by a pilot signal output from the external battery charging facility. The battery charging device converts an alternating current electricity of the external battery charging facility to the charging electricity for charging the high voltage battery. When the plug-in ECU is activated, the plug-in ECU outputs a wake-up signal to the hybrid ECU (i.e., HV-ECU), which executes a charging and discharging control operation of the high voltage battery. Thus, when the plug-in ECU and the hybrid ECU are activated, the charging process of the high voltage battery is executed using the power source of the external battery charging facility.

The hybrid vehicle having the plug-in function is in an early phase of diffusion. Thus, the hybrid vehicle without the plug-in function is still major. Accordingly, for example, it is necessary to prepare both the hybrid ECU having the plug-in function as an additional function and the hybrid ECU having the fundamental function without the plug-in function independently for the hybrid vehicle. In this case, since two types of the hybrid ECUs are prepared, if a circuit board made of a printed circuit board, on which various electronic elements and circuits are mounted, for the hybrid ECU having the plug-in function is developed independently from the hybrid ECU having the fundamental function only, the cost of development is necessary for each hybrid ECU.

Here, when the hybrid ECU having the plug-in function is compared with the hybrid ECU having the fundamental function only, the fundamental functions of both ECUs have many common parts. Accordingly, it may be possible to share a circuit board with each hybrid ECU. If the circuit board is commonly used in each hybrid ECU, the development cost of both ECUs is much reduced. Thus, the product cost is also reduced.

However, when the additional function of the plug-in function is added to the common circuit board, it is necessary to add a bypass capacitor, for example. Thus, it may be necessary to redesign a regulator and a control circuit for the regulator, which provide the power source circuit. The existence and non-existence of the bypass capacitor much affects a phase margin of the power source circuit. In some cases, at output of the power source circuit may oscillate. Accordingly, it is important to use a method without adding and removing a bypass capacitor when the circuit board is commonly used in each hybrid ECU.

The above issue is not limited to the hybrid ECU. The similar issue arises when a ECU having only a fundamental function and another ECU having a fundamental function and an additional function are independently developed.

SUMMARY

It is an object of the present disclosure to provide a vehicular electronic control device executing a fundamental function and an additional function and having a circuit board, which is easily diverted to a circuit board of another electronic control device executing only a fundamental function without changing a bypass capacitor.

Accordingly to a first aspect of the present disclosure, an electronic control device for executing a fundamental function and an additional function, which is added selectively to the fundamental function, includes: a fundamental circuit element that executes the fundamental function; an additional circuit element that executes the additional function and is added to the fundamental circuit element; and a printed wiring board that mounts the fundamental circuit element and the additional circuit element thereon. The printed circuit board has a rectangular shape, which is divided into a first region and a second region. The fundamental circuit element is mounted in the first region, and the additional circuit element is mounted in the second region. The fundamental circuit element includes an operation voltage generating circuit and a bypass capacitor. The operation voltage generating circuit supplies an operation voltage to at least a part of the fundamental circuit element and the additional circuit element. The bypass capacitor functions for the additional circuit element. The bypass capacitor is connected to a power source wiring pattern for supplying the operation voltage generated by the operation voltage generating circuit to the additional circuit element. The bypass capacitor is arranged in the first region at a position nearer the second region than the operation voltage generating circuit.

In the above electronic control device, the printed wiring board having the rectangular shape is divided into the first and second regions. The fundamental circuit element is mounted in the first region, and the additional circuit element is mounted in the second region. Thus, a circuit construction of the first region corresponds to a circuit construction of an electronic control device for executing only the fundamental function.

Here, in order to simplify the circuit construction and to reduce the dimensions of the wiring board, the operation voltage generating circuit for supplying the operation voltage to at least a part of the fundamental circuit element supplies the operation voltage to at least a part of the additional circuit element. In this case, in general, the bypass capacitor is arranged on the power source wiring pattern between the operation voltage generating circuit and the additional circuit element at a position near the additional circuit element. The bypass capacitor absorbs an instantaneous variation of the operation voltage and restricts the propagation of a noise to the power source wiring pattern. However, if the bypass capacitor is removed when the additional circuit element is not necessary, the operation voltage generating circuit may be re-designed, and therefore, it is difficult to utilize the electronic control device as a circuit construction of an electronic control device executing only the fundamental function.

In the above electronic control device, the bypass capacitor for the additional circuit element is arranged at a position nearer the second region than the operation voltage generating circuit. Thus, even when a part of the printed wiring board corresponding to the first region is utilized as a printed wiring board of an electronic control device for executing only the fundamental function, it is not necessary to change the bypass capacitor. Further, the bypass capacitor is arranged in the first region nearer the second region than the operation voltage generating circuit. Accordingly, the bypass capacitor can be arranged in the first region near the additional circuit element as much as possible. Thus, the circuit construction of the electronic control device is easily utilized as the circuit construction of an electronic control device for executing only the fundamental function.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
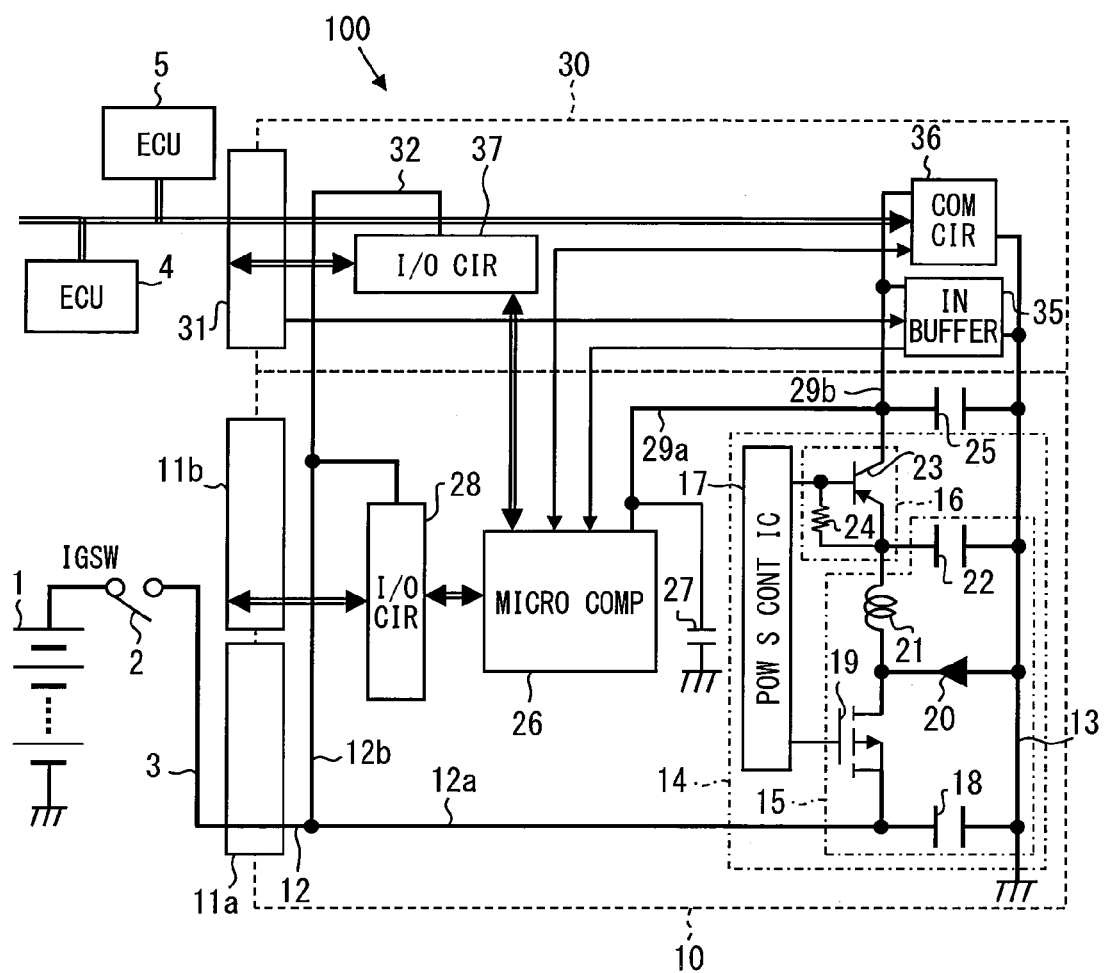
FIG. 1 is a diagram showing a circuit board of an electronic control device according to an example embodiment.

An electronic control device according to an example embodiment will be explained with reference to drawings. FIG. 1 shows a schematic construction of a circuit board of an electronic control device 100 according to the present embodiment. The electronic control device 100 is applied to a hybrid ECU that executes not only a fundamental function for controlling a charging and discharging operation of a high voltage battery when a vehicle is running but also an additional function for controlling a charging operation of the high voltage battery from an external battery charging facility. Accordingly, FIG. 1 shows a connection example between the device 100 and a vehicular battery 1 or an external ECU 4, 5 when the electronic control device is applied to the hybrid ECU. Here, the electronic control device is not limited to the hybrid ECU. Alternatively, the electronic control device may be applied to a case where it is necessary to prepare an electronic control device executing only a fundamental function and an electronic control device executing the fundamental function and an additional function.

As shown in FIG. 1, the circuit board of the electronic control device 100 includes a printed wiring board having a rectangular shape, on which various circuit such as an operation voltage generating circuit 14, a microcomputer 26, an input and output circuit 28, 37, an input buffer 35 and a communication circuit 36 and an electronic element such as a bypass capacitor are mounted. The circuit board is partitioned to a first region 10 and a second region 30 so as to divide the printed wiring board into two parts. In the first region 10, constructional elements of a fundamental circuit for executing the fundamental function are mounted. The fundamental circuit includes an operation voltage generating circuit 14, a bypass capacitor 25, a microcomputer 26 and an input and output circuit 28 as a fundamental circuit element. In the second region 30, constructional elements of an additional circuit for executing the additional function are mounted. The additional circuit includes an input buffer 35, a communication circuit 36 and an input and output circuit 37 as an additional circuit element.

Here, FIG. 1 merely shows some elements of the circuit board of the device 100 according to the present embodiment. Thus, the actual circuit board of the device 100 includes various circuits and electronic elements other than the circuits and electronic elements shown in FIG. 1. For example, the electronic control device according to the present embodiment includes a communication circuit for receiving a wake-up signal from other ECU when a main switch 2 is in an off state, and an operation voltage supplying circuit for supplying an operation voltage to the communication circuit. The communication circuit and the operation voltage supplying circuit are not shown in FIG. 1. Further, the device 100 includes a power source turn-on circuit for turning on a relay switch arranged in parallel to the main switch 2 when the communication circuit receives the wake-up signal. Since the device 100 includes these circuits, the power source energizes a whole of the electronic control device 100 when the device 100 receives the wake-up signal from other ECU even if the main switch 2 is in the off state. Obviously, the power source energizes a whole of the electronic control device 100 when the device 100 receives the wake-up signal from other ECU under a condition that the main switch 2 is in the on state. Thus, each circuit mounted in the first region 10 and the second region 30 is activated and functions. Here, the communication circuit, the operation voltage supplying circuit and the power source turn-on circuit may be mounted in the second region 30.

The microcomputer 26 of the electronic control device 100 executes a charging and discharging control operation as the fundamental function of the high voltage battery (which is not shown) when the vehicle runs. In the charging and discharging control operation, information about the charging and discharging state (i.e., state of charge) of the high voltage battery is obtained from a battery ECU, and a chargeable and dischargeable amount of the high voltage battery is calculated. When a driving torque is generated for the vehicle, and it is possible to discharge from the high voltage battery, the driving torque to be generated is assigned to each of the motor and the engine according to the dischargeable amount of the battery. When the vehicle generates a brake torque, the microcomputer 26 controls a regenerative brake to function when the battery is chargeable, so that the microcomputer 26 executes the charging control operation of the battery. In this case, the microcomputer 26 controls to coincide the brake torque of the regenerative brake and the brake torque of the brake system with a required brake torque.

Further, the microcomputer 26 executes a charging control operation as the additional function of the high voltage battery using the external battery charging facility. In the charging control operation, the alternating current supplied from the external battery charging device is converted to the direct current, and the direct current is supplied to the high voltage battery. Thus, the high voltage battery is charged. When the microcomputer 26 determines based on the state of charge (i.e., SOC) of the high voltage battery obtained from the battery ECU that the battery is fully charged, the microcomputer 26 completes the charging operation of the battery. In this case, the microcomputer 26 outputs the wake-up signal to the range electronic control device (i.e., range ECU) so that the range ECU is activated. The range ECU controls the range switching system to function using an electric motor, and the range switching system is arranged in an automatic transmission. The microcomputer 26 controls the range ECU not to switch from a parking range to other range even if a user operates a start switch so that the device 100 prevents the vehicle from mistakenly moving during the battery is being charged.

The input buffer 35 inputs a sensor signal for detecting a state of the range switching function when the additional function is performed. The communication circuit 36 communicates with an external ECU 4, 5 such as the range ECU. The input and output circuit 28, 37 outputs the driving signal to various driving circuits. The input buffer 35, the communication circuit 36 and the input and output circuit 37 are connected to an external device via a connector 31, which is arranged in the second region 30.

The electronic control device according to the present embodiment includes the first region 10 having the rectangular shape and the second region 30 having the rectangular shape, and the printed wiring board is divided into the first and second regions 10, 30. Accordingly, when the circuit board of the electronic control device 100 according to the present embodiment is diverted to a circuit board of the electronic control device executing the fundamental function only, a part of the circuit board including the first region 10 is prepared by separating the second region 30. In this case, the shape of the part of the circuit board corresponding to the first region 10 has the rectangular shape, which is similar to a conventional device.

The circuit construction of the first region 10 and the circuit construction of the second region 30 will be explained as follows.

In the first region 10, a connector 11a, 11b is arranged. In FIG. 1, the connector 11a, 11b includes a power source connector 11a and a signal connector 11b, which are separated from each other. Alternatively, the power source connector 11a and the signal connector 11b may be integrated into one connector. The power source connector 11a is connected to a wiring as a power source line 3, which extends from the vehicular battery 1 via the main switch 2. The power source line 3 is connected to a power source wiring pattern 12 via the connector 11a. The power source wiring pattern 12 is branched to a first power source wiring pattern 12a and a second power source wiring pattern 12b. The first power source wiring pattern 12a is connected to the operation voltage generating circuit 14 in the first region 10. The second power source wiring pattern 12b extends from the first region 10 to the second region 30. Further, the second power source wiring pattern 12b is connected to the input and output circuit 28 in the first region 10 and the input and output circuit 37 in the second region 30. Accordingly, a battery voltage is supplied from the vehicular battery 1, and the operation voltage generating circuit 14 and the input and output circuits 28, 37 are operable when the main switch 2 turns on, or when the wake-up signal is received from other ECU and a relay switch (not shown) turns on.

The operation voltage generating circuit 14 regulates or decreases the battery voltage so that the circuit 14 generates the operation voltage for the microcomputer 26 and the like. The operation voltage generating circuit 14 includes the first regulator 15, the second regulator 16 and the power source control IC 17.

The first regulator 15 includes an input capacitor 18, a P channel MOS transistor 19, a diode 20, a coil 21 and an output capacitor 22. The input capacitor 18 stabilizes the battery voltage to be input to the operation voltage generating circuit 14. The MOS transistor 19 has a source connecting to the vehicular battery side, and a drain connecting to the coil 21. The gate of the MOS transistor 19 is connected to the power source control IC 17. The diode 20 connects to a wiring pattern between the drain of the MOS transistor 19 and the coil 21. The diode 20 has a forward direction as a direction from a ground wiring pattern 13 to the wiring pattern. Further, the output capacitor 22 is connected to a downstream side of the coil 21, so that the output capacitor 22 stabilizes the output voltage of the first regulator 15.

The operation of the first regulator 15 will be explained as follows. The MOS transistor 19 is controlled by the power source control IC 17 to turn on and off periodically. When the MOS transistor 19 turns on, the current based on the battery voltage flows through the MOS transistor 19. The current causes the coil 21 to accumulate energy, and charges the output capacitor 22. When the MOS transistor 19 turns off, the flow of the current based on the battery voltage is interrupted. In this case, in the first regulator 15, the energy accumulated in the coil 21 provides the current to flow into the output capacitor 22 via the diode 20 and the coil 21. When the MOS transistor 19 turns on and off, the output voltage generated at the output capacitor 22 is reduced to be lower than the battery voltage. For example, the first regulator 15 reduces the output voltage to be six volts from the battery voltage of twelve volts.

The second regulator 16 includes a PNP transistor 23 and a resistor 24. The PNP transistor 23 has an emitter connecting to the output capacitor 22, and a collector connecting to the microcomputer 26, the input buffer 35, and the power source terminal of the communication circuit 36. The base of the PNP transistor 23 is connected to the power source control IC 17. The resistor 24 is a pull-up resistor, and is connected between the emitter and the base of the PNP transistor 23.

In the above case, the power source control IC 17 adjusts the base current of the PNP transistor 23 according to the output voltage of the second regulator 16, so that the second regulator 16 generates a predetermined output voltage. For example, the second regulator 16 generates a voltage having 5 volts based on a voltage having 6 volts, which is output from the first regulator 15.

In the present embodiment, the operation voltage generating circuit 14 mounted in the first region 10 supplies the operation voltage to the microcomputer 26 mounted in the same first region 10, and further, supplies the operation voltage to the input buffer 35 and the communication circuit 36 mounted in the second region 30 via the power source wiring patterns 29a, 29b. Thus, the circuit construction is simplified and the dimensions of the circuit board are minimized, compared with a case where the power source circuit is mounted independently.

The power source wiring pattern 29b for connecting the operation voltage generating circuit 14 with the input buffer and the communication circuit 36 is connected to the bypass capacitor 25. The power source wiring pattern 29a for connecting between the operation voltage generating circuit 14 and the microcomputer 26 is connected to the bypass capacitor 27. The bypass capacitors 25, 27 absorb an instantaneous variation of the operation voltage generated by the operation voltage generating circuit 14, and restrict a propagation of a noise to the power source wiring pattern 29a, 29b.

Next, when the circuit board having the above described structure is applied to the circuit board of the electronic control device for executing the fundamental function only, an operation and a construction will be explained as follows.

Figure 2:
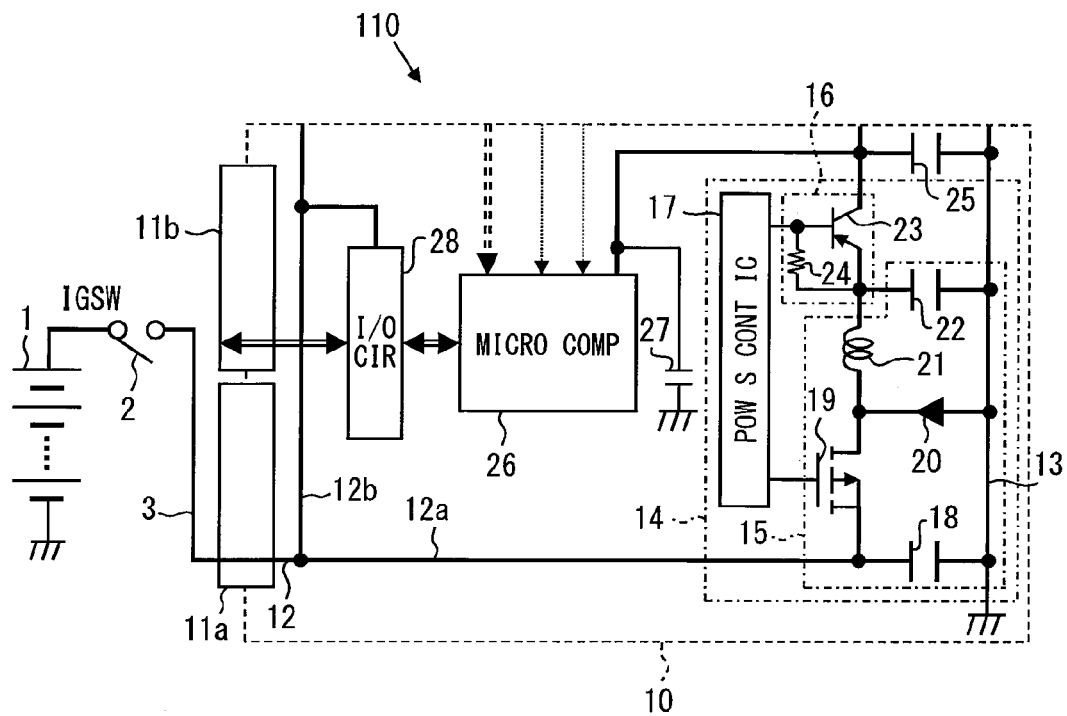
FIG. 2 is a diagram showing a circuit board of another electronic control device executing only a fundamental function.

FIG. 2 shows an example of the circuit board of the electronic control device 110 for executing the fundamental function only when the circuit board is prepared from the circuit board shown in FIG. 1. As shown in FIG. 2, the circuit board of the electronic control device 110 is almost equal to the circuit board in the first region 10 of the circuit board shown in FIG. 1. Accordingly, the circuit board of the electronic control device 110 is prepared such that the wiring pattern of the printed circuit board for providing the electronic control device 100 in FIG. 1 is utilized essentially, and various same circuits and electronic elements in the electronic control device 100 in FIG. 1 are mounted on the wiring pattern of the printed circuit board.

Here, as described above, in the electronic control device 100, the bypass capacitor 25 with respect to the circuits such as the input buffer 35 and the communication circuit 36 mounted in the second region 30 is mounted in the first region 10.

The bypass capacitor 25 functions as a load with respect to the power source, in general. Further, in general, it is necessary to arrange the bypass capacitor 25 near the circuits such as the input buffer 35 and the communication circuit 36, which may generate a noise. If the bypass capacitor 25 is arranged in the second region 30, the bypass capacitor 25 is removed from the electronic control device 110 for executing the fundamental function only. In this case, it is necessary to re-design the operation voltage generating circuit 14. Thus, it may be difficult to apply the circuit board in FIG. 1 to the circuit board of the electronic control device 110 for executing the fundamental function only.

On the other hand, in the electronic control device 100 according to the present embodiment, since the bypass capacitor 25 is mounted in the first region 10, even when the circuit board in FIG. 1 is applied to the circuit board of the electronic control device 110 in FIG. 2, the bypass capacitor 25 is not removed from the electronic control device 110. As shown in FIG. 1, the bypass capacitor 25 is arranged nearer the second region 30 than the operation voltage generating circuit 14. Accordingly, the bypass capacitor 25 is arranged in the first region 10 near the input buffer 35 and the communication circuit 36 as much as possible. Further, the input buffer 35 and the communication circuit 36, which receive the operation voltage from the operation voltage generating circuit 14, are arranged in the second region 30 at a boundary between the first region 10 and the second region 30 so that the input buffer 35 and the communication circuit 36 are adjacent to the bypass capacitor 25 across the boundary between the first region 10 and the second region 30. Accordingly, even when the bypass capacitor 25 is arranged in the first region 10, the capacitor 25 sufficiently and effectively functions.

Accordingly, the circuit board of the electronic control device 100 in the present embodiment can be easily applied to the circuit board of the electronic control device 110 for executing only the fundamental function.

First Modification

Figure 3:
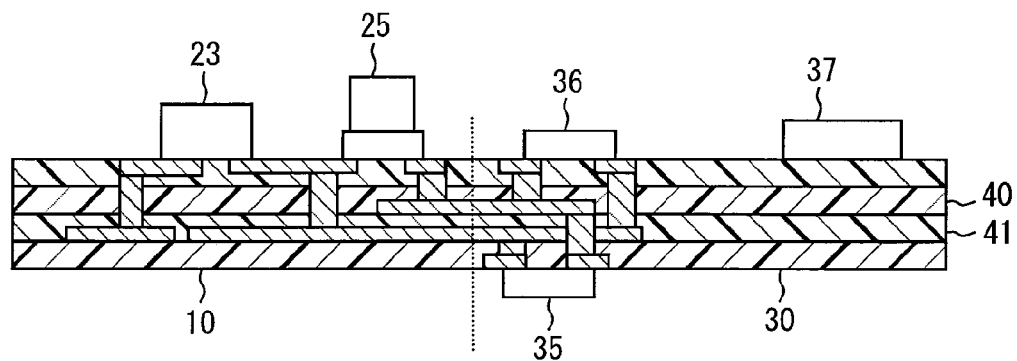
FIG. 3 is a diagram showing a circuit board according to a first modification of the embodiment.

For example, as described in the embodiment, when the number of circuits, on which the bypass capacitor 25 is required to be mounted, is equal to or more than two, as shown in FIG. 3, multiple circuits such as the input buffer 35 and the communication circuit 36 may be mounted on each of a front side and a back side of the printed wiring board. When multiple circuits are mounted on each side of the board, each circuit can be arranged in the second region 30 near the boundary between the first region 10 and the second region 30 even when multiple circuits exist.

Second Modification

Figure 4:
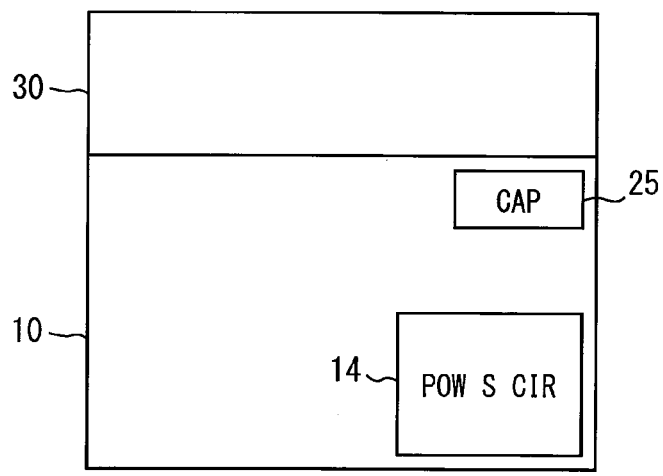
FIG. 4 is a diagram showing a circuit board according to a second modification of the embodiment.

In the above embodiment, the bypass capacitor 25 is arranged nearer the second region 30 than the operation voltage generating circuit 14. As shown in FIG. 4, the operation voltage generating circuit 14 may be arranged at a periphery portion of the first region 10 other than the boundary between the first region 10 and the second region 30. The operation voltage generating circuit 14 includes large elements such as a capacitor and a transistor. Thus, the circuit 14 occupies a comparatively large area. Accordingly, when the circuit 14 is arranged at the periphery portion of the first region 10 other than the boundary between the first region 10 and the second region 30, it is easy to secure an area for other circuits, other electronic elements, and wiring patterns for connecting the circuits and the electronic elements. Further, although the operation voltage generating circuit 14 may easily generate a noise, when the circuit 14 is arranged at the periphery portion of the first region 10, the circuit 14 is positioned at a position far from other circuits as much as possible.

Third Modification

Figure 5:
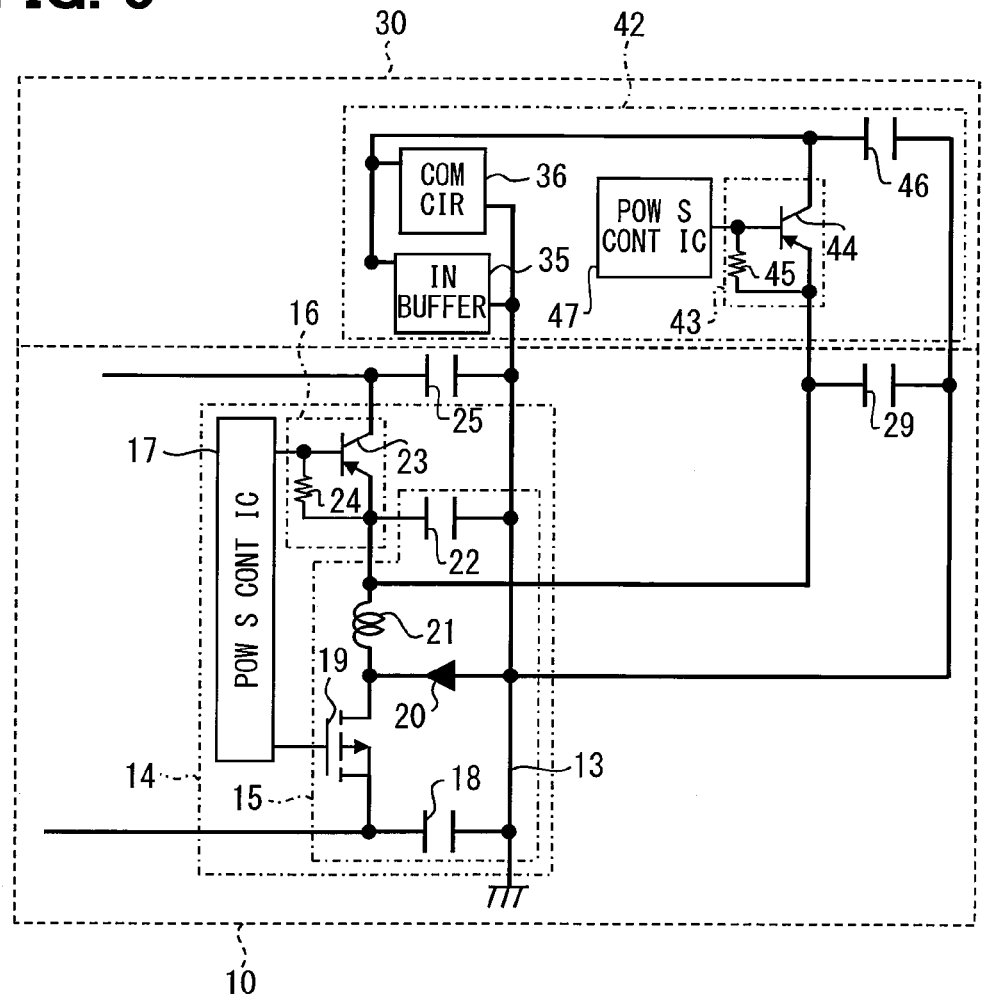
FIG. 5 is a diagram showing a circuit board according to a third modification of the embodiment.

In the above embodiment, the voltage generated by the second regulator 16 of the operation voltage generating circuit 14 is supplied as the operation voltage to the input buffer 35 and the communication circuit 36 in the second region 30. Alternatively, as shown in FIG. 5, the voltage generated by the first regulator 15 of the operation voltage generating circuit 14 may be supplied as the operation voltage to the circuits in the second region 30. In this case, the voltage generated by the first regulator 15 may be much larger than the operation voltage of the input buffer 35 and the communication circuit 36. Thus, it is necessary to add a third regulator 43 having the PNP transistor 44 and the resistor 45 in the second region 30. The third regulator 43 has a similar construction as the second regulator 16. Further, it is necessary to add a power source control IC 47 for controlling the third regulator 43. In FIG. 5, the capacitor 29 is a bypass capacitor for the third regulator 43. The capacitor 46 stabilizes the operation voltage, which is generated by the third regulator 43.

In the above case, even if the load current in circuits mounted in the second region 30 is large, and therefore, the voltage variation is also large, the influence of large voltage variation is prevented from affecting on circuits such as the microcomputer 26 mounted in the first region 10.

Fourth Modification

In the above embodiment, when the circuit board of the electronic control device 100 in FIG. 1 is applied to the circuit board of the electronic control device 110 in FIG. 2, a portion corresponding to the second region 30 is removed, and only another portion corresponding to the first region 10 provides the circuit board. Alternatively, the portion corresponding to the second region 30 may be remained in the circuit board without mounting circuits and electronic elements in the second region 30. In this case, the wiring pattern in the second region 30 may not be formed.

Fifth Modification

When the circuit board of the electronic control device 110 in FIG. 2 is prepared, a wiring pattern shown as a dotted line may be removed. Alternatively, the wiring pattern shown as the dotted line may be remained.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control device for executing a fundamental function and an additional function, which is added selectively to the fundamental function, the electronic control device comprising:
    a fundamental circuit element that executes the fundamental function;
    an additional circuit element that executes the additional function and is added to the fundamental circuit element; and
    a printed wiring board that mounts the fundamental circuit element and the additional circuit element thereon,
    wherein the printed circuit board has a rectangular shape, which is divided into a first region and a second region,
    wherein the fundamental circuit element is mounted in the first region, and the additional circuit element is mounted in the second region,
    wherein the fundamental circuit element includes an operation voltage generating circuit and a bypass capacitor,
    wherein the operation voltage generating circuit supplies an operation voltage to at least a part of the fundamental circuit element and the additional circuit element,
    wherein the bypass capacitor functions for the additional circuit element,
    wherein the bypass capacitor is connected to a power source wiring pattern for supplying the operation voltage generated by the operation voltage generating circuit to the additional circuit element, and
    wherein the bypass capacitor is arranged in the first region at a position nearer the second region than the operation voltage generating circuit.

2. The electronic control device according to claim 1, wherein the first region has a rectangular shape, and the second region has another rectangular shape.

3. The electronic control device according to claim 1, wherein the additional circuit element includes a first circuit, to which the operation voltage generating circuit supplies the operation voltage,
    wherein the first circuit of the additional circuit element is arranged in the second region near a boundary between the first region and the second region, and
    wherein the first circuit of the additional circuit element is adjacent to the bypass capacitor across the boundary between the first region and the second region.

4. The electronic control device according to claim 3, wherein the first circuit includes a plurality of circuit elements, to which the operation voltage generating circuit supplies the operation voltage, and
    wherein the plurality of circuit elements are arranged on each of a front surface and a back surface of the printed wiring board in the second region near the boundary between the first region and the second region.

5. The electronic control device according to claim 1, wherein the operation voltage generating circuit is arranged at a periphery portion of the first region other than the boundary between the first region and the second region.

6. The electronic control device according to claim 1, wherein the operation voltage generating circuit includes a first regulator and a second regulator,
    wherein the first regulator decreases a power source voltage, and generates a predetermined first voltage,
    wherein the second regulator decreases the first voltage, and generates a predetermined second voltage,
    wherein the second voltage is supplied as the operation voltage to the fundamental circuit element,
    wherein the additional circuit element includes a second circuit, to which the operation voltage generating circuit supplies the operation voltage,
    wherein the second circuit of the additional circuit element includes a third regulator and a circuit element,
    wherein the third regulator decreases the first voltage, and generates a predetermined third voltage, and
    wherein the third voltage is supplied as the operation voltage to the circuit element.

* * * * *